(12) United States Patent
Lee et al.

(10) Patent No.: US 11,552,281 B2
(45) Date of Patent: Jan. 10, 2023

(54) PANEL SUBSTRATE AND METHOD FOR MANUFACTURING DISPLAY DEVICE INCLUDING THE SAME

(71) Applicant: SAMSUNG DISPLAY CO., LTD., Yongin-si (KR)

(72) Inventors: Kwangmin Lee, Goyang-si (KR); Jong-Duk Roh, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/235,534

(22) Filed: Apr. 20, 2021

(65) Prior Publication Data

US 2022/0028313 A1    Jan. 27, 2022

(30) Foreign Application Priority Data

Jul. 23, 2020 (KR) .................. 10-2020-0091546

(51) Int. Cl.
G09G 3/00 (2006.01)
H01L 27/32 (2006.01)
H01L 51/56 (2006.01)

(52) U.S. Cl.
CPC .......... H01L 51/56 (2013.01); H01L 27/3223 (2013.01)

(58) Field of Classification Search
CPC ... H01L 51/56; H01L 27/3223; B32B 43/003; B32B 43/006
See application file for complete search history.

(56) References Cited

U.S. PATENT DOCUMENTS

| 9,287,335 | B2* | 3/2016 | Yi ........................ H01L 51/56 |
| 9,673,014 | B2 | 6/2017 | Kim et al. |
| 10,177,327 | B2 | 1/2019 | Jung et al. |
| 10,268,058 | B2 | 4/2019 | Moon |
| 10,340,316 | B2* | 7/2019 | Lee ...................... H01L 27/3262 |
| 10,608,209 | B2 | 3/2020 | Cheon et al. |
| 2007/0177069 | A1* | 8/2007 | Lee ...................... H01L 51/5246 349/56 |
| 2013/0249877 | A1* | 9/2013 | Choi ................... H01L 27/1248 345/205 |
| 2018/0190734 | A1* | 7/2018 | Kang ..................... B32B 15/08 |

FOREIGN PATENT DOCUMENTS

| KR | 10-1174834 | 8/2012 |
| KR | 10-2018-0023722 | 3/2018 |
| KR | 10-2018-0029739 | 3/2018 |
| KR | 10-1846549 | 4/2018 |
| KR | 10-2019-0031399 | 3/2019 |
| KR | 10-2060541 | 12/2019 |
| KR | 10-2021-0045574 | 4/2021 |
| KR | 10-2021-0104283 | 8/2021 |

* cited by examiner

*Primary Examiner* — Sardis F Azongha
(74) *Attorney, Agent, or Firm* — F. Chau & Assoiates, LLC

(57) ABSTRACT

A method for manufacturing a display device includes providing a panel substrate including a panel area, a peripheral area, and a dummy pattern disposed at a boundary between the panel area and the peripheral area. A protection part is disposed on the panel substrate. A first processing line overlaps a first outline of the panel area extending from a first point of an outline of the panel area. A second processing line overlaps a second outline extending from the first point in a direction different from the first outline are defined. The protection part is partially cut along the first processing line. The protection part is fully cut along the second processing line. The dummy pattern overlaps the first point.

22 Claims, 15 Drawing Sheets

PANEL SUBSTRATE AND METHOD FOR MANUFACTURING DISPLAY DEVICE INCLUDING THE SAME

CROSS-REFERENCE TO RELATED APPLICATIONS

This U.S. non-provisional patent application claims priority under 35 U.S.C. § 119 to Korean latent Application No. 10-2020-0091546, filed on Jul. 23, 2020, the entire contents of which are hereby incorporated by reference.

TECHNICAL FIELD

The present disclosure relates to a display device and, more particularly, to a panel substrate and a method for manufacturing a display device including the panel substrate.

DISCUSSION OF THE RELATED ART

Various display devices used in multimedia devices such as televisions, mobile phones, tablet computers, navigation units and game consoles have been developed. The display device includes various functional members such as a display panel, an input sensor, a window, and an optical film.

The functional members, which have undergone a manufacturing or processing process, are coupled with each other. The display device having a laminated structure is manufactured through a plurality of coupling processes.

SUMMARY

A method for manufacturing a display device includes providing a panel substrate including a panel area, a peripheral area around the panel area, and a dummy pattern disposed at a boundary between the panel area and the peripheral area. A protection part is disposed on the panel substrate. The protection part Includes a first processing line and a second processing line. The first processing line overlaps a first outline of the panel area extending from a first point of an outline of the panel area, A second processing line overlapping a second outline of the panel area extending from the first point in a direction different from the first outline are defined. The protection part is partially cut along the first processing line. The protection part is full cut along the second processing the dummy pattern overlaps the first point when viewed on a plane.

A method for manufacturing a display device includes providing a base substrate including a panel area and a peripheral area around the panel area. A pixel layer is formed on the panel area. A dummy pattern is formed on a boundary between the panel area and the peripheral area. A protection part is disposed on the panel area and the peripheral area. The protection part is irradiated with a laser beam to overlap an outline of the panel area.

A panel substrate includes a base substrate on which a panel area and a peripheral area at least partially surrounding the panel area. A pixel layer is disposed on the panel area. A thin-film encapsulation layer is disposed on the pixel layer. A dummy pattern is disposed on the base substrate and overlaps a boundary between the panel area and the peripheral area when viewed on a plane.

A method for manufacturing a display device includes disposing a dummy pattern on a panel substrate. The panel substrate is cut from a first point along a first processing line to a partial thickness and the panel substrate is from the first point along a second processing line to a full thickness.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE DRAWINGS

Figure 1:
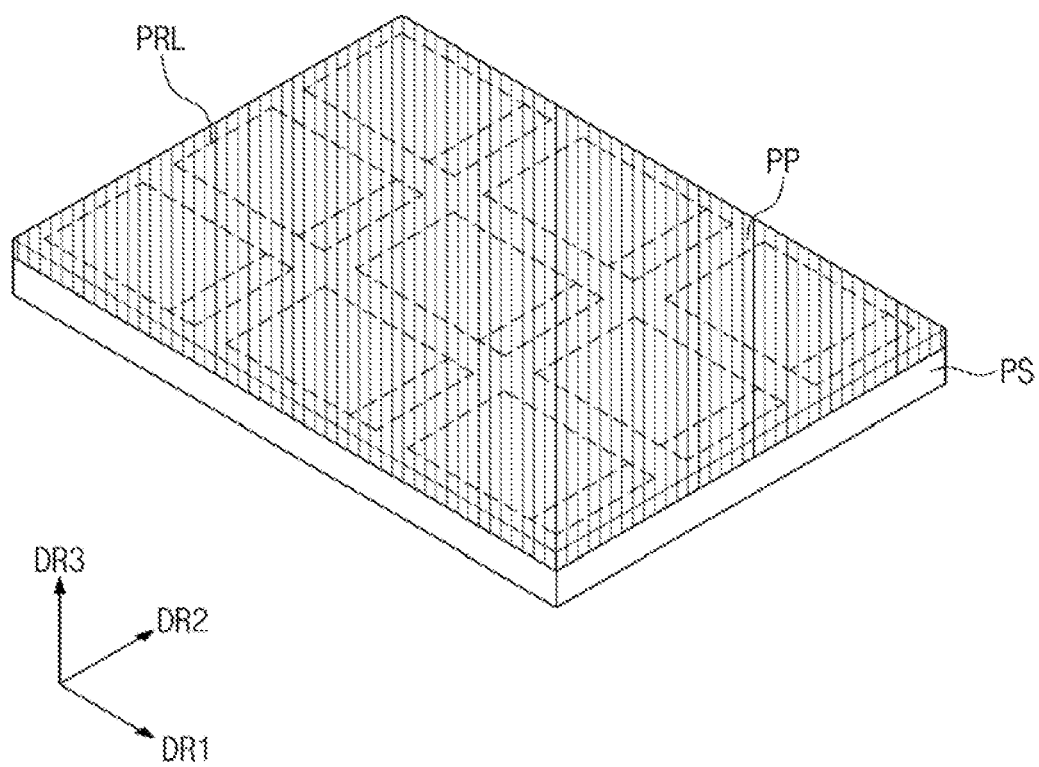
FIG. 1 is a perspective view illustrating a panel substrate and a protection part disposed on the panel substrate according to an exemplary embodiment of the inventive concept.

In this specification, it will also be understood that when one component (or region, layer, portion) is referred to as being 'on', 'connected to', or 'coupled to' another component, it can be directly disposed connected/coupled on/to the one component, or an intervening third component may also be present.

Like reference numerals may refer to like elements throughout the specification and the figures. Also, in the figures, the thickness, ratio, and dimensions of components may be exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the present disclosure. The terms of a singular form may include plural forms unless referred to the contrary.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described in detail with reference to the accompanying drawings.

FIG. 1 is a perspective view illustrating a panel substrate and a protection part disposed on the panel substrate according to an exemplarily embodiment of the inventive concept.

Referring to FIG. 1, a panel substrate PS may include a plurality of display panels that display an image. The display panels may be separated from each other by a process of cutting the panel substrate PS.

The panel substrate PS may include two sides each extending in a first direction DR1 and two sides crossing the first direction DR1. When viewed on a plane (i.e. in a plan view), the panel substrate PS may have a rectangular shape. In this specification, a feature of "when viewed on the plane" represents a figure when viewed in a third direction DP3 that is perpendicular to a plane defined by the first direction DR1 and the second direction DR2.

A protection part PP may be disposed on the panel substrate PS. The protection part PP may protect display panels of the panel substrate PS. When viewed on the plane, a plurality of processing lines PRL may be defined, on the protection part PP. The processing lines PRL may be a path that is irradiated with a laser beam in a peeling process that will be described later.

When viewed on the plane, the protection part PP may have the same area as the panel substrate PS. However, the embodiment of the inventive concept is not necessarily limited thereto. The protection part PP may have an area that is less than that of the panel substrate PS. The protection part PP may have an area that is large enough to cover the display panels of the panel substrate PS.

Figure 2:
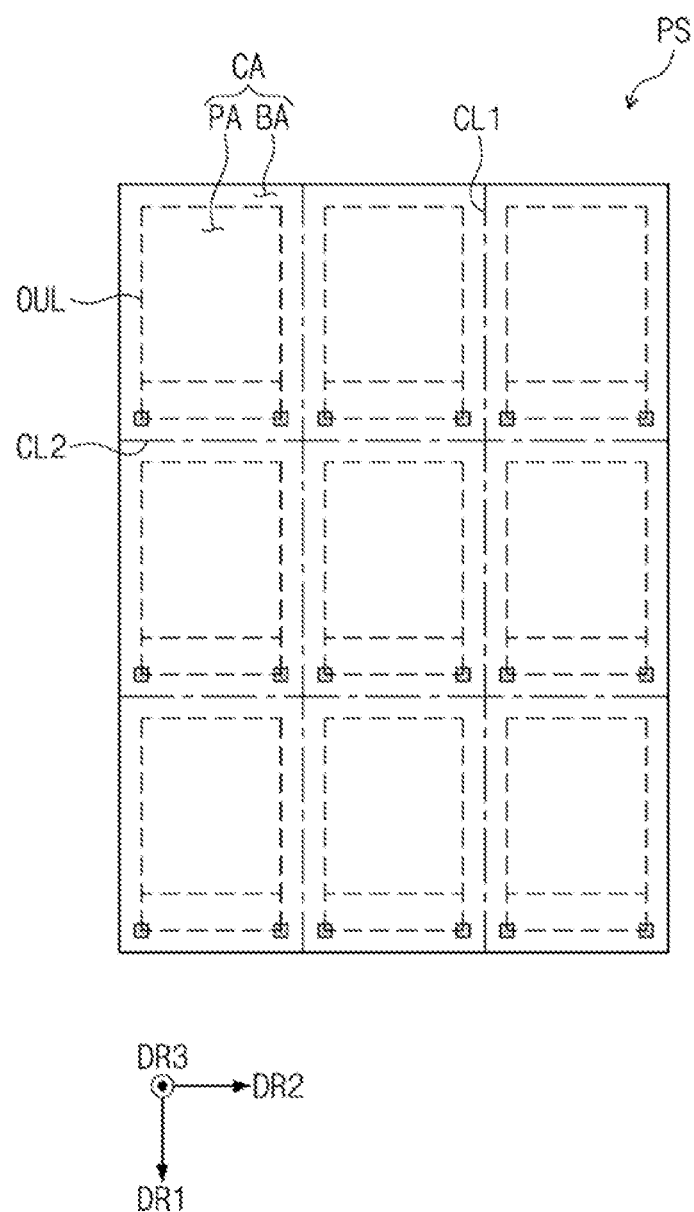
FIG. 2 is a plan view illustrating the panel substrate in FIG. 1.

FIG. 2 is a plan view illustrating the panel substrate in FIG. 1.

Referring to FIG. 2, the panel substrate. PS may include a plurality of cell areas CA. The cell areas CA may be arranged in the first direction DR1 and the second direction DR2. The cell areas CA may be divided by cutting lines defined in the panel substrate PS. After the peeling process that will be described later is performed, the cell areas CA may be cut along the cutting hues and separated from each other.

For example, the cutting lines may include a first cutting line CL1 and a second cutting line CL2. The first cutting line CL1 may extend in the first direction DR1. The second cutting line CL2 may extend in the second direction DR2. The first cutting line CL1 and the second cutting line CL2 may cross each other.

Although the panel substrate PS is divided into nine cell areas CA in FIG. 2, this is illustrative, and the embodiment of the inventive concept is not necessarily limited thereto. For example, the panel substrate PS pray be divided into more than nine cell areas CA or fewer than nine cell areas CA.

Each of the cell areas CA may include a panel area PA and a peripheral area BA. The panel area. PA may be disposed at a center of the cell area CA. When viewed on the plane, the panel area PA may have a substantially rectangular shape. The peripheral area BA may at least partially surround the panel area PA. For example, the peripheral area BA may fully surround the panel area PA.

Figure 3:
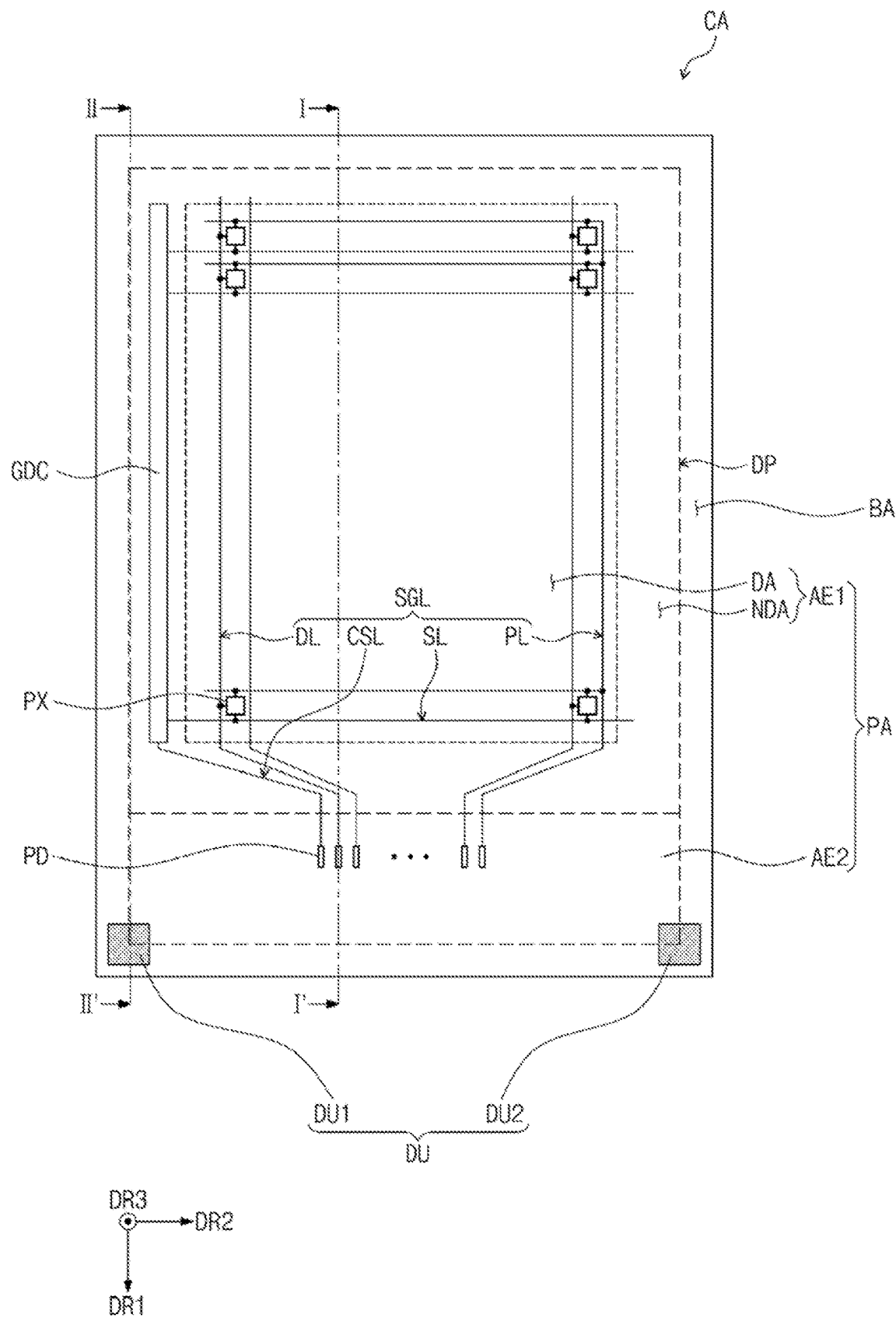
FIG. 3 is an enlarged plan view illustrating one cell area of cell areas in FIG. 2.

FIG. 3 is an enlarged plan view illustrating one cell area of the cell areas in FIG. 2.

Referring to FIG. 3, a display panel DP may be disposed on the panel area PA. The display panel DP may be formed by removing a portion of the panel area PA through a scribing process.

When viewed on the plane, the panel area PA may include a first area AE1 and a second area AE2. The first area AE1 and the second area AE2 may be arranged in the first direction DR1.

The first area AE1 may include a display area DA and a non-display area NDA. The display area DA may be an area on which pixels PX of the display panel DP, which will be described later, are disposed. The display area DA may be a central portion of the first area AE1.

The non-display area NDA may be an area on which the pixels PX are not disposed. The non-display area NDA may be an area at least partially surrounding the display area DA in the first area AE1.

The display panel DP may include a driving circuit GDC, a plurality of signal lines SGL, a plurality of pixels PX, and a plurality of signal pads PD. The pixels PX may be disposed on the display area DA to generate an image.

The driving circuit GDC may be disposed on the non-display area NDA of the first area AE1. The driving circuit GDC may include a scan driving circuit. The scan driving circuit may generate a plurality of scan signals and sequentially output the scan signals to a plurality of scan lines SL that will be described later.

The scan driving circuit may include a plurality of thin-film transistors fabricated through the same process as the driving circuit, e.g., a low temperature polycrystalline silicon (LTPS) process.

The signal lines SGL may be disposed on the first area AE1. For example, the signal lines SGL may include scan lines SL, data lines DL, a power line PL, and a control signal line CSL.

Each of the scan lines SL may extend in the second direction DR2. Each of the scan lines SL may be connected to the corresponding pixel PX. Each of the data lines EL may extend in the first direction DR1. Each of the data lines EL may be connected to the corresponding pixel PX. The power line PL is connected to the pixels PX. The control signal line CSL may provide control signals to the scan driving circuit.

The signal pads PD may be disposed on the second area AE2. Each of the signal pads PD may be electrically connected to the corresponding signal line SGL.

For example, each of the data lines DL may extend from the first area AE1 to the second area AE2. Each of the data lines DL may be connected to the corresponding signal pad PD. Each of the power line PL and the control signal line CSL may extend from the first area. AE1 to the second area AE2. Each of the power line PL and the control signal line CSL may be connected to the corresponding signal pad PD.

Figure 4:
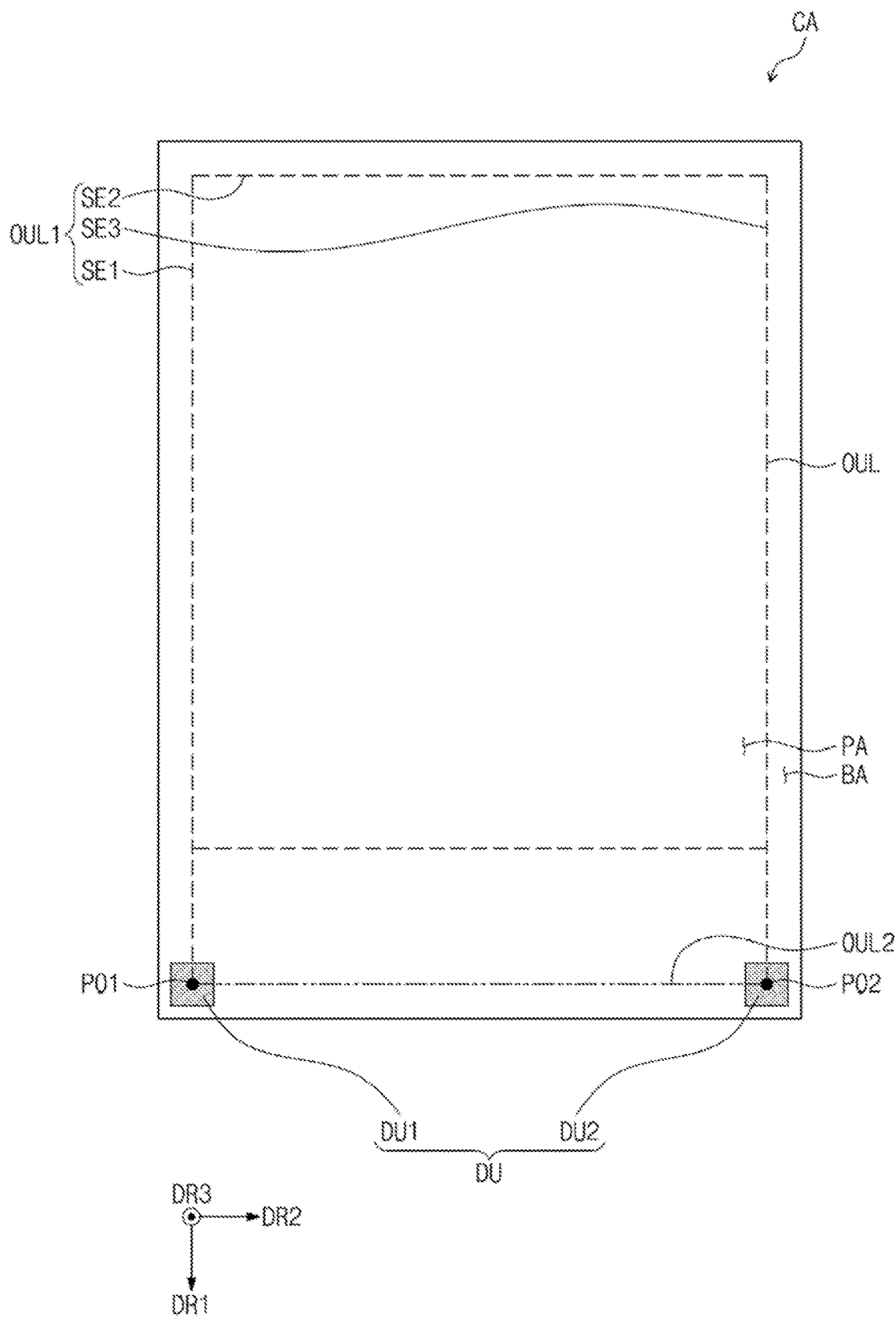
FIG. 4 is a plan view illustrating a dummy pattern and an outline of a panel area in FIG. 3.

FIG. 4 is a plan view illustrating a dummy pattern and an outline of the panel area in FIG. 3. For convenience of description, other components except for a dummy pattern DU and an outline OUL of the panel area PA are omitted in FIG. 4. However, it may be understood that these elements are still actually part of the panel area.

Referring to FIG. 4, the outline OUL of the panel area PA may define a boundary between the panel area PA and the peripheral area BA. The outline OUL may include a first outline OUL1 and a second outline OUL2. In FIG. 4, the first outline OUL1 is illustrated by a dotted line, and the second outline OUL2 is illustrated by an alternate long and two short dashes line to distinguish the first outline OUL1 and the second outline OUL2 from each other.

The first outline OUL1 may include a first section SE1 extending from a first point PO1 in the first direction DR1, a second section SE2 extending from an end of the first section SE11 in the second direction DR2, and a third section. SE3 extending from an end of the second section SE2 in the first direction DR1. The first point PO1 may define a vertex of the panel area PA adjacent to the second area AE2. When viewed on the plane, the first outline OUL1 may have a shape of a rectangle that is open at the bottom.

The second outline OUL2 may extend from the first point PO1 in the second direction DR2. The second outline OUL2 may meet the first outline OUL1 at a second point PO2 that is defined as an end of the third section SE3. The second point PO2 may be spaced apart from the first point PO1 in the second direction DR2 define a vertex of the panel area PA adjacent to the second area AE2.

The first outline OUL1 and the second outline OUL2 may meet at the first point PO1 and the second point PO2. However, the inventive concept is not necessarily limited to the above-described shape of each of the first outline OUL1 and the second outline OUL2. The shape of each of the first outline OUL1 and the second outline OUL2 may be changed according to a shape of the display panel DP.

According to an embodiment of the inventive concept, the dummy pattern DU may include a first dummy pattern DU1 and a second dummy pattern DU2. The first dummy pattern DU1 may be disposed at the first point PO1. When viewed on the plane, the first dummy pattern DU1 may overlap a portion of the second area AE2 of the panel area PA adjacent to the first point PO1 and a portion of the peripheral area BA adjacent to the first point PO1.

When viewed on the plane, the first dummy pattern DU1 may have a rectangular shape. However, the inventive concept is not necessarily limited thereto. For example, the shape of the first dummy pattern DU1 may be changed.

The second dummy pattern DU2 may be disposed at the second point PO2. The second dummy pattern DU2 may be spaced apart from the first dummy pattern DU1 in the second direction DR2. When viewed on the plane, the second dummy pattern DU2 may overlap a portion of the second area AE2 adjacent to the second point PO2 and a portion of the peripheral area BA adjacent to the second point PO2.

When viewed on the plane, the second dummy pattern DU2 may have a rectangular shape. However, the inventive concept is not necessarily limited to the shape of the second dummy pattern DU2.

Figure 5:
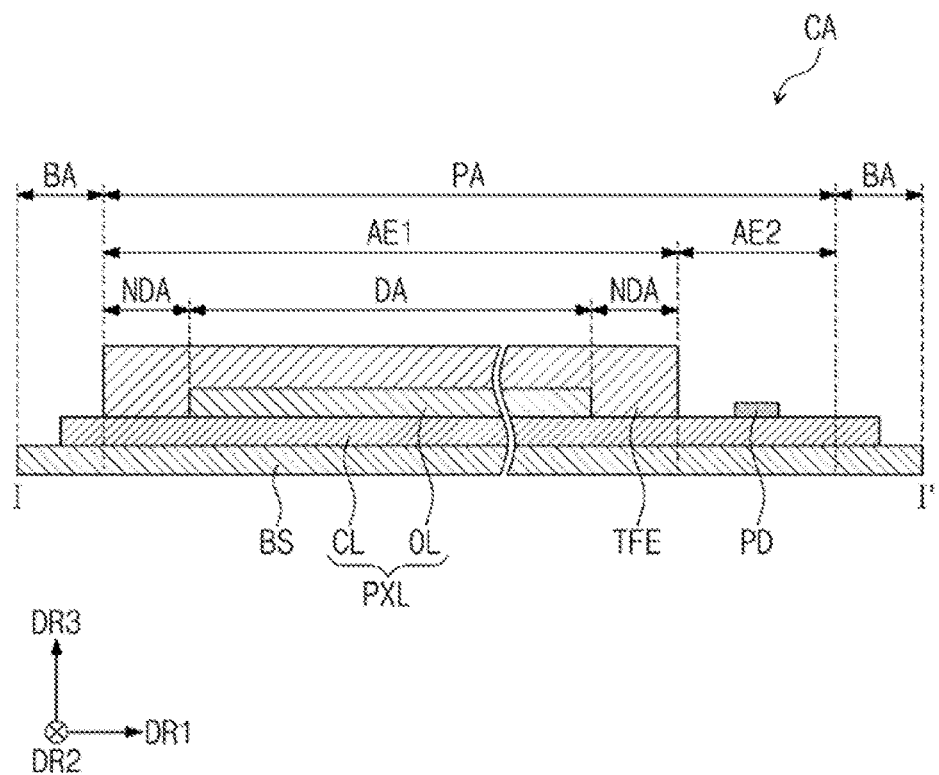
FIG. 5 is a cross-sectional view taken along line I-I' of FIG. 3.

FIG. 5 is a cross-sectional view taken along line I-I' of FIG. 3.

Referring to FIGS. 3 to 5, when viewed on a cross-section, the panel area PA may include a base substrate BS, a pixel layer PXL, a thin-film encapsulation layer TFE, and a signal pad PD.

According to an embodiment of the inventive concept, the base substrate BS may be a rigid substrate that is not designed to bend. For example, the base substrate BS may include glass.

The base substrate BS may extend from the panel area PA to the peripheral area BA. For example, the base substrate BS may be disposed over the entire cell area CA. The base substrate BS may be a base layer of the panel substrate PS (refer to FIG. 2).

According to an embodiment of the inventive concept, the pixel layer PXL may be disposed on the base substrate BS. The pixel layer PXL may include the pixels PX illustrated in FIG. 3. For example, the pixel layer PXL may include a pixel element layer CL and a display element layer OL.

The circuit element layer CL may be disposed on the base substrate BS. The circuit element layer CL may overlap the panel area PA. The circuit element layer CL may extend to a portion of the peripheral area BA adjacent to the panel area PA.

The circuit element layer CL may include at least one insulation layer and a circuit element. For example, the circuit element layer CL may include scan lines SL and the data lines DL in FIG. 3. When viewed on the cross-section, the insulation layer may be disposed between the scan lines SL and the data lines DL. The scan lines SL may be separated from the data lines DL by the insulation layer.

The display element layer OL may be disposed on the circuit element layer CL. The display element layer OL may overlap the display area DA of the first area AE1 of the panel area PA. The display element layer DL might not overlap the non-display area NDA of the first area AE1.

The display element layer OL may include a plurality of light emitting elements and a pixel defining layer. For example, each of the light emitting elements may include an organic light emitting diode. The light emitting elements may be disposed in a pixel opening defined by the pixel defining layer.

The thin-film encapsulation layer TFE may be disposed on the display element layer OL and a portion of the circuit element layer CL. The thin-film encapsulation layer TFE may overlap the first area AE1 of the panel area PA. For example, the thin-film encapsulation layer TFE may overlap the display area DA and the non-display area NDA of the fast area AE1.

The thin-film encapsulation layer TFE may include a first inorganic layer, an organic layer, and a second inorganic layer, which are sequentially laminated in the third direction DR3. However, this is merely illustrative, and the embodiment of the inventive concept is not necessarily limited to the thin-film encapsulation layer TFE according to an embodiment of the inventive concept. For example, the thin-film encapsulation layer TFE according to an embodiment of the inventive concept may further include a plurality of inorganic layers and a plurality of organic layers.

According to an embodiment of the inventive concept, the signal pads PD may be disposed on the circuit element layer CL. The signal pads PD may overlap the second area AE2. The signal pads PD may be connected to the signal lines of the circuit element layer CL.

Figure 6:
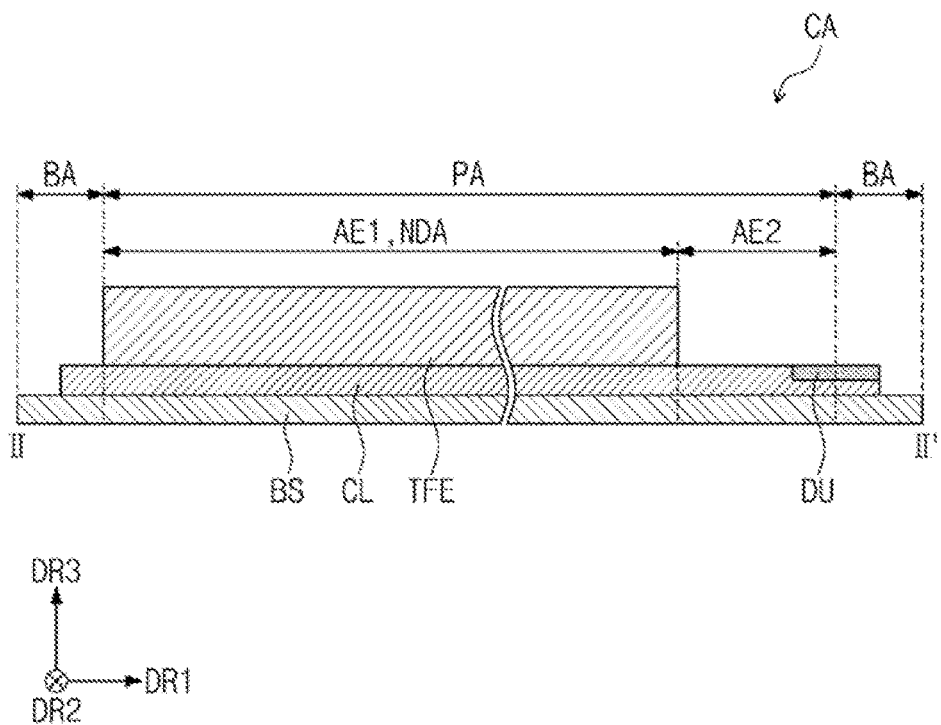
FIG. 6 is a cross-sectional view taken along line II-II' of FIG. 3.

FIG. 6 is a cross-sectional view taken along line II-II' of FIG. 3. FIG. 6 illustrates a cross-section of the second area AE2 and the non-display area NDA of the first area AE1 of the panel area PA. Thus, the thin-film encapsulation layer TFE is disposed on the circuit element layer CL instead of the display element layer OL in FIG. 6. The dummy pattern DU in FIG. 6 may be the first dummy pattern DU1 in FIG. 3.

Referring to FIG. 6, the dummy pattern DU may be disposed in the circuit element layer CL. For example, the dummy pattern DU may be disposed on the same layer as the scan line SL (refer to FIG. 3). The dummy pattern DU may be provided in conjunction with the scan line SL through a process of providing the scan line SL.

However, the embodiment of the inventive concept is not necessarily limited thereto. For example, the dummy pattern DU may be disposed between the circuit element layer CL and the base substrate BS or disposed on the circuit element layer CL.

According to an embodiment of the in concept, the dummy pattern DU may include a material satisfying a predetermined property. For example, the dummy pattern DU may include a material having a thermal expansion coefficient similar to that of the base substrate BS and a melting temperature greater than that of the base substrate BS. Also, the dummy pattern DU may include a material having a low absorptance, a low transmittance, and a high reflectance with respect to a laser beam.

For example, when the base substrate BS includes glass, the dummy pattern DU may include molybdenum. The molybdenum has a thermal expansion coefficient similar to that of glass, a high melting temperature (about 2100° C.), and a high reflectance with respect to a laser beam.

However, the embodiment of the inventive concept is not necessarily limited to the material of the dummy pattern DU. For example, the material of the dummy pattern DU may be changed according to the material of the base substrate BS.

According to an embodiment of the inventive concept, when viewed on a cross-section, the dummy pattern DU may be disposed around a boundary between the panel area PA and the peripheral area BA. Effects caused by the dummy pattern DU will be clearly understood when a method for manufacturing the display device is described later.

Figure 7:
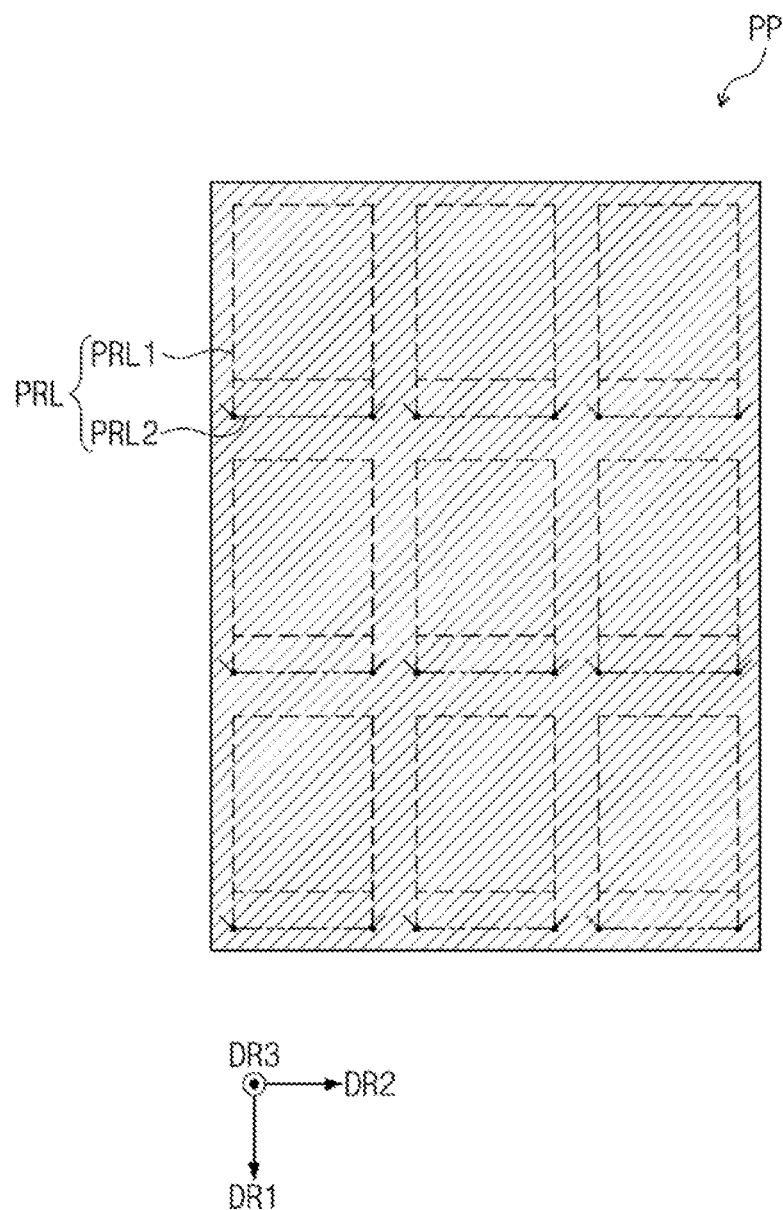
FIG. 7 is a plan view illustrating the protection part in FIG. 1.
Figure 8:
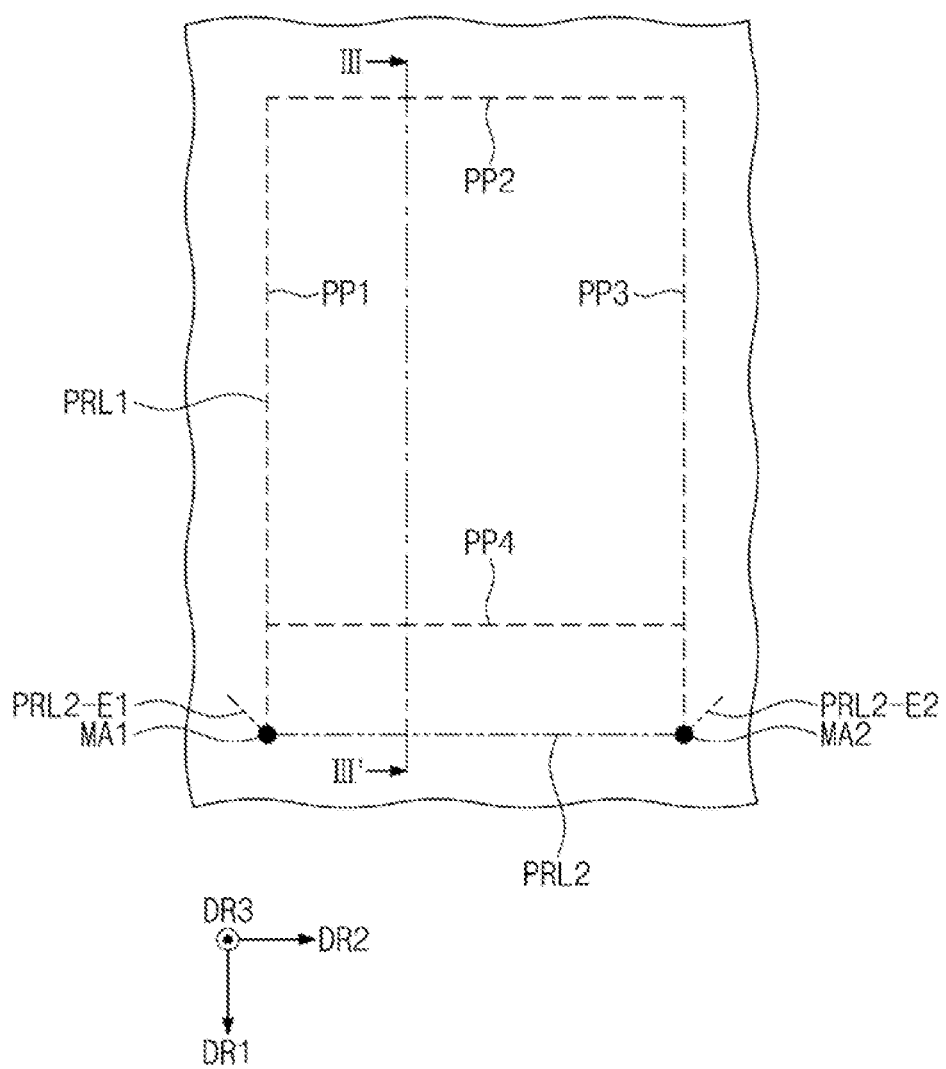
FIG. 8 is an enlarged view illustrating one processing line in FIG. 7.
Figure 9:
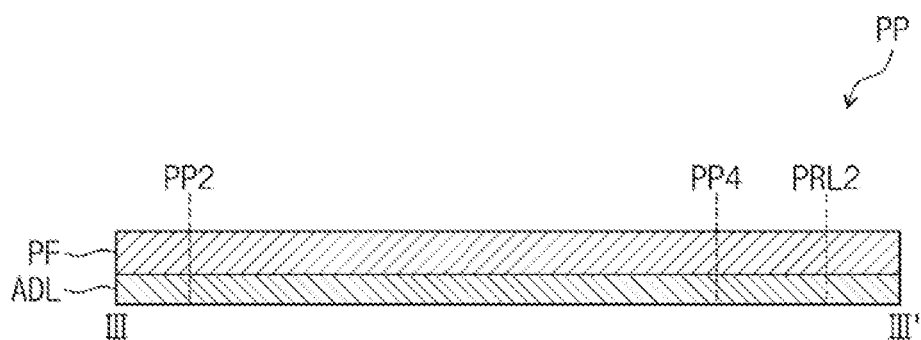
FIG. 9 is a cross-sectional view taken along line III-III' of FIG. 8.

FIG. 7 is a plan view illustrating the protection part in FIG. 1. FIG. 8 is an enlarged view illustrating one processing line in FIG. 7. FIG. 9 is a cross-sectional view taken along line III-III' of FIG. 8. For convenience of description, a first processing line PRL1 is illustrated by a dotted line, and a second processing line PRL2 is illustrated by an alternate long and two short dashes line in FIG. 8.

Referring to FIGS. 7 and 8, the processing line PRL may be defined on the protection part PP. When viewed on the plane, the processing line PRL may have a substantially rectangular shape. The processing line PRL may overlap the panel area PA in FIG. 4.

The processing line PRL may include a first processing line PRL1 and a second processing line PRL2. For example, the first processing line PRL1 may include a first portion PP1, a second portion PP2, and a third portion PP3.

The first portion PP1 may extend from a first processing point MA1 in the first direction DR1. The first processing point MA1 may be a virtual point defined at a vertex of the processing line PRL. The first processing point MA1 may overlap the first point PO1 in FIG. 4. It is to be understood that as used herein, the term "virtual" may refer to a point or line of reference and need not correspond to an actual structural landmark.

The second portion PP2 may extend from an end of the first portion PP1 in the second direction DR2. The third portion PP2 may extend from an end of the scone portion PP2 in the first direction DR1. The third portion PP3 may be spaced apart from the first portion PP1 in the second direction DR2.

When viewed on the plane, the first processing line PRL1 may overlap the first outline OUL1 of the panel area PA in FIG. 4.

The first processing line PRL1 may further include a fourth portion PP4. The fourth portion PP4 may be disposed between the first portion PP1 and the third portion PP3. When viewed on the plane, the fourth portion PP4 may overlap a boundary between the first area AE1 and the second area AE2 in FIG. 3.

The second processing line PRL2 may extend from the first processing point MA1 in the second direction DR2. The second processing line PRL2 may meet a second processing point MA2 of the third portion PP3. The second processing point MA2 may be defined as a virtual point defining another vertex of the processing line PRL as well as aft end of the third portion PP3. The second processing point MA2 may be spaced apart from the first processing point MA2 in the second direction DR2.

When viewed on the plane, the second processing line PRL2 may overlap the second outline OUL2. As a result, the first processing line PRL1 and the second processing line PRL2 may meet at the first processing point MA1 and the second processing point MA2.

According to an embodiment of the inventive concept, the second processing line PRL2 may include a first extension portion PRL2-E1 and a second extension portion PRL2-E2, which extend in an inclined direction. The first extension portion PRL2-E1 may extend from the first processing point MA1 in a first inclined direction. When viewed on the plane, the first extension portion PRL2-E1 may overlap the peripheral area BA (refer to FIG. 4). The first extension portion PRL2-E1 may extend in a direction toward a left upper end with respect to FIG. 8.

The second extension portion PRL2-E2 may extend from the second processing point MA2 in a second inclined direction. When viewed on the plane, the second extension portion PRL2-E2 may overlap the peripheral area BA (refer to FIG. 4). The second extension portion PRL2-E2 may extend in a direction toward a right upper end with respect to FIG. 8.

Referring to FIG. 9, the protection part PP may include a protection film PF and an adhesive layer ADL.

The protection film PF may include a plastic film. The protection film PF may include polyethylene terephthalate (PET).

The adhesive layer ADL may be disposed below the protection film PF, as shown. The adhesive layer ADL may include an adhesive material. The adhesive layer ADL may include a material having a low adhesive force and a high viscoelasticity. For example, the adhesive layer ADL may include a silicon-based adhesive material. However, this is merely illustrative, and the embodiment of the inventive concept is not necessarily limited to the adhesive material of the adhesive layer ADL according to an embodiment of the inventive concept. For example, the adhesive layer ADL may include a urethane-based adhesive material.

Hereinafter, a method for manufacturing the display device according to an embodiment of the inventive concept will be explained. The method for manufacturing the display device according to an embodiment of the inventive concept relates to a process of peeling a protection part PP disposed on a panel substrate PS including a plurality of display panels among various processes for manufacturing the display device.

Figure 10:
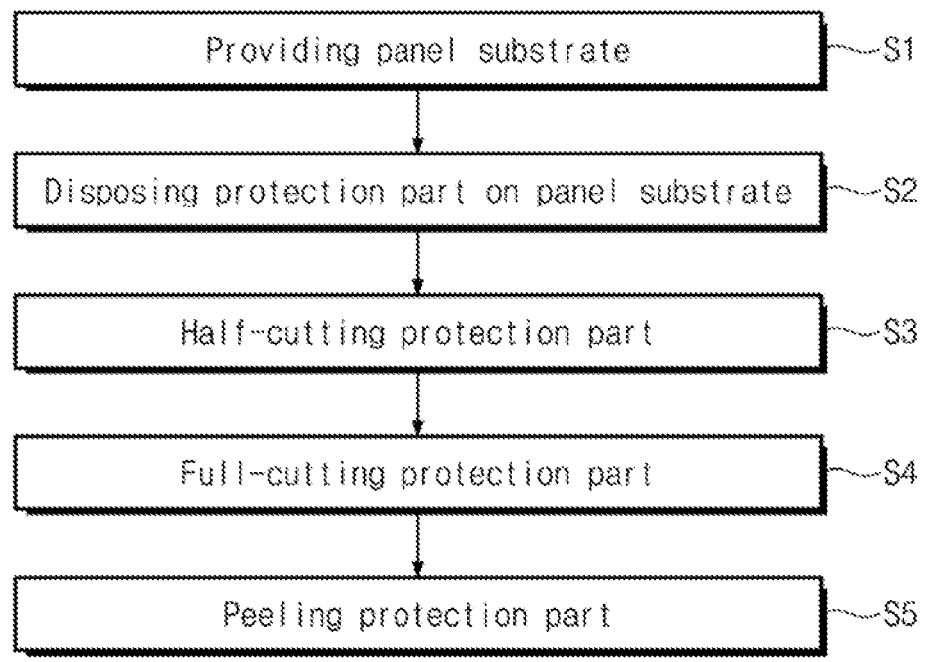
FIG. 10 is a flowchart representing a method of manufacturing a display panel according to an exemplary embodiment of the inventive concept.

FIG. 10 is a flowchart representing the method of manufacturing the display panel according to an embodiment of the inventive concept.

Figure 11:
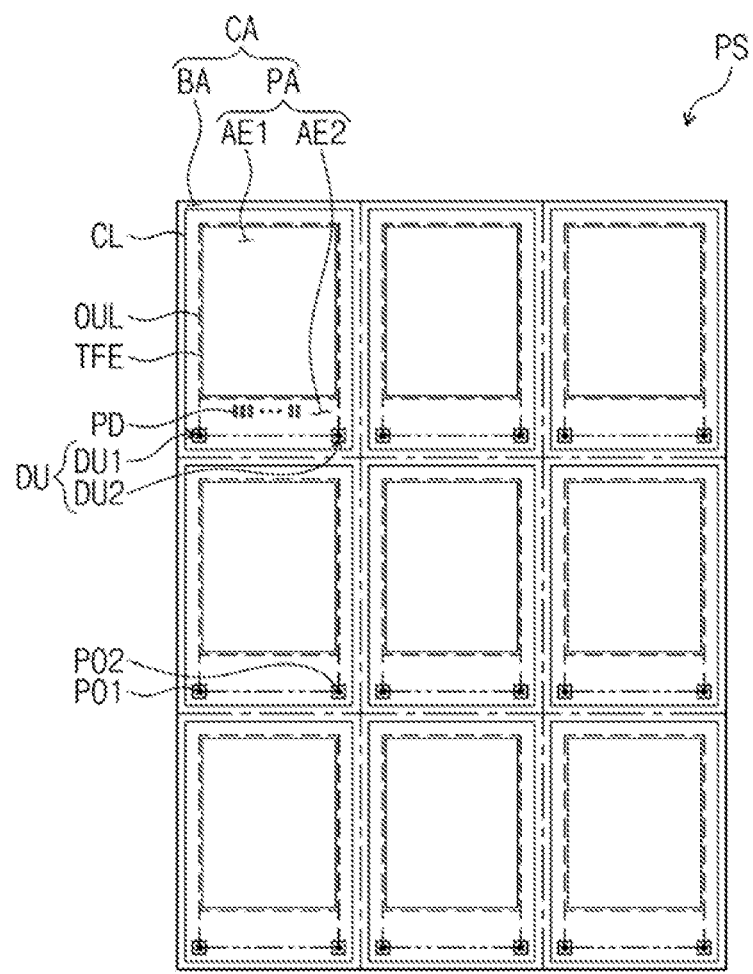
FIGS. 11 to 16 are views for explaining each of processes described in FIG. 10.
Figure 12:
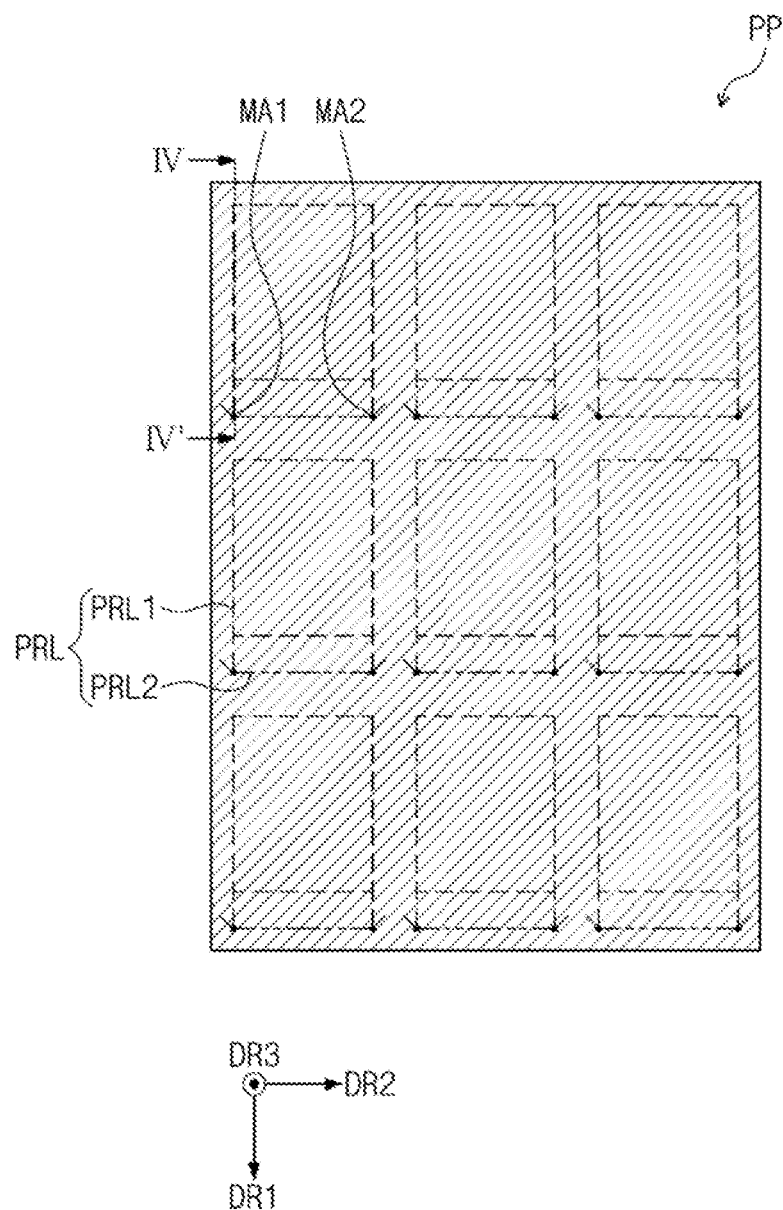
Figure 13:
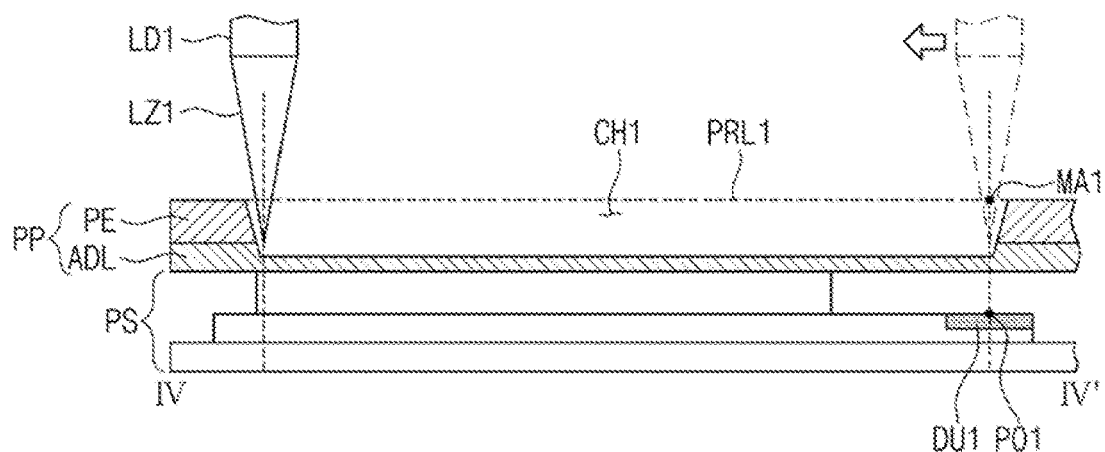
Figure 13:
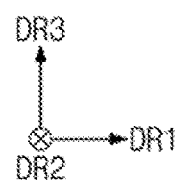
Figure 14:
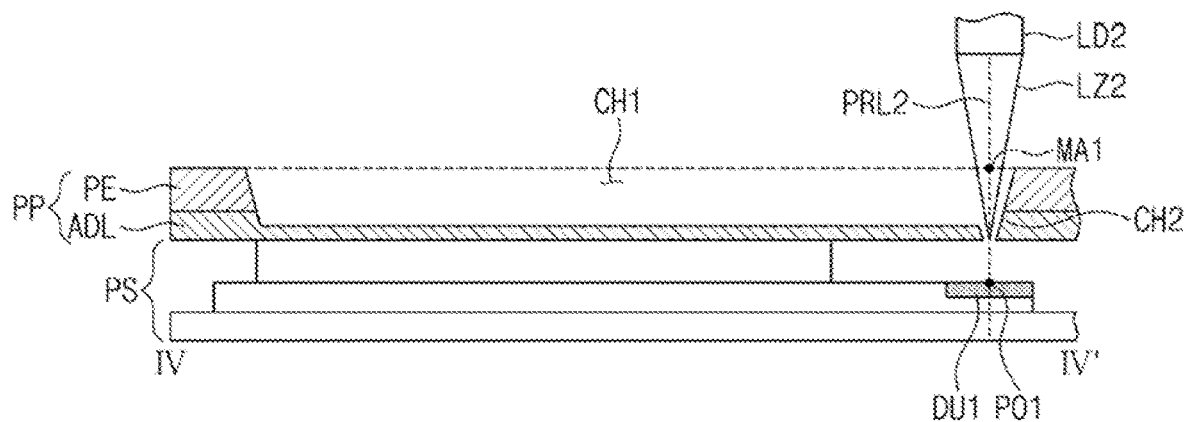
Figure 14:
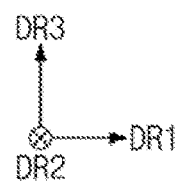

FIGS. 11 to 16 are views for explaining each of processes described in FIG. 10. FIGS. 13 and 14 are cross-sectional views taken along line IV-IV' in FIG. 12.

Referring to FIGS. 10 and 11, a panel substrate PS may be provided in a process S1. The process S1 may include a process of forming a circuit element layer CL on a base substrate BS, a process of forming a display element layer OL on the circuit element layer CL, and a process of forming a thin-film encapsulation layer TFE on the display element layer OL (refer to FIG. 5).

The panel substrate PS may include a plurality of cell areas CA. Each of the cell areas CA may include a panel area PA, a peripheral area BA, and a dummy pattern DU. The peripheral area BA may be disposed around the panel area PA to surround the panel area PA. An outline OUL may be defined as a boundary between the panel area PA and the peripheral area BA.

The dummy pattern DU may be disposed on the boundary between the panel area PA and the peripheral area BA. For example, a first dummy pattern DU1 may be disposed at a first point OP1 of the panel area PA. A second dummy pattern DU2 may be disposed at a second point PO2 spaced apart from the first point PO1 in the second direction DR2 and defined as another vertex of the panel area PA.

When viewed on the plane, the thin-film encapsulation layer TFE may be disposed on a first area AE1 of the panel area PA, and signal pads PD may be disposed on a second area AE2 of the panel area PA.

The panel substrate PS in FIG. 11 may have the same structure as the above-described panel substrate PS in FIGS. 3 to 5.

Referring to FIGS. 10 and 12, a protection part PP may be disposed on the panel substrate PS in a process S2. A plurality of processing lines PRL may be defined on the protection part PP. Each of the processing lines PRL may overlap the outline OEL of the panel area PA in FIG. 11.

According to an exemplary embodiment of the present disclosure, a method for manufacturing a display device includes disposing a dummy pattern on a panel substrate. The panel substrate is cut from a first point along a first processing line to a partial thickness and from the first point along a second processing line to a full thickness. The dummy pattern may be disposed at a boundary between a panel area and a peripheral area of the panel substrate and the dummy pattern may overlap the first point. The first processing line may overlap a first outline of the panel area extending from the first point and the second processing line may overlap a second outline of the panel area, extending from the first point. The cutting of the panel substrate along the first processing line may be performed in a first direction and the cutting of the panel substrate along the second processing line may be performed in a second direction different from the first direction. The first processing line and the second processing line may be part of a protection part that is disposed on the panel substrate.

Referring to FIG. 10, the protection part PP may be partially cut (for example, the cut may be to a depth of about half) along a first processing line PRL1 in a process S3. In the process S3, a portion of the protection part PP may be cut along a thickness direction (e.g., the third direction DR3) of the protection part PP.

For example, referring to FIG. 12, a first laser device LD1 may irradiate the protection part PP with a first laser beam LZ1 along the first processing line PRL1. The first laser device LD1 may continuously irradiate the first processing line PRL1 with the first laser beam LZ1 while moving in the first direction DR1 or the second direction DR2. The first laser device LD1 may process the first processing line PRL1 by using a first processing point MA1 as a start point and a second processing point MA2 as an end point (refer to FIG. 12).

Referring to FIG. 13, the first laser beam LZ1 may cut a portion of the protection part PP. For example, in terms of the third direction DR3, the first laser beam LZ1 may cut the entire protection film PF and a portion of the adhesive layer ADL disposed below the protection film PF (refer to FIG. 13). Thus, a first cutting groove CH1 extending along the first processing line PRL1 may be defined in the protection part PP.

Referring to FIGS. 10 and 12 again, the protection part PP may be fully-cut (e.g. cut to its full depth) along a second processing line PRL2 in a process S4. In the process S4, the entire protection part PP may be cut with respect to the thickness direction (e.g., the third direction DR3) of the protection part PP.

A second laser device LD2 may irradiate the protection part PP with a second laser beam LZ2 along a second processing line PRL2. The second laser device LD2 may continuously irradiate the protection part PP with the second laser beam LZ2 in a section between the first processing point MA1 and the second processing point MA2. The second laser device LD2 may irradiate an extension portion disposed at each of both sides of the second processing line PRL2 with the second laser beam LZ2.

Referring to FIG. 14, the second laser beam LZ2 may have energy greater than that of the first laser beam LZ1. Thus, the second laser beam LZ2 may cut the entire thickness portion of the protection part PP with respect to the third direction DR3. Thus, a second cutting groove CH2 extending along the second processing line PRL2 may be defined in the protection part PP.

According to an embodiment of the inventive concept, the process S3 and the process S4 may be performed at the same time. However, the embodiment of the inventive concept is not necessarily limited thereto. For example, the process S4 may be performed, and then the process S3 may be performed.

The first laser beam LZ1 and the second laser beam LZ2 may be irradiated to die first processing point MA1 and the second processing point MA2, at which the first processing line PRL1 and the second processing line PRL2 meet, in an overlapped manner.

Thus, both of heat generated by the first laser beam LZ1 and heat generated by the second laser beam LZ2 may be applied, in a double manner, to portions adjacent to the first point PO1 and the second point PO2, which overlap the first processing point MA1 and the second processing point MA2, in the panel substrate PS.

When the heat is applied to the same point in the double manner, the base substrate BS of the panel substrate PS may be damaged. For example, a crack may be generated at portions of the base substrate BS, which overlap the first point PO1 and the second point PO2.

To resolve this limitation, according to an embodiment of the inventive concept, the panel substrate PS may include a first dummy pattern DU1 and a second dummy pattern DU2, which overlap the first point PO1 and the second point PO2, respectively, and are, disposed on the base substrate BS.

The first dummy pattern DU1 and the second dummy pattern DU2 may absorb the heat applied to the base substrate BS. As described above, when the base substrate BS is glass, each of the first dummy pattern DU1 and the second dummy pattern DU2 may include molybdenum.

Since each of the first dummy pattern DU1 and the second dummy pattern DU2 has a high melting temperature, the first dummy pattern DU1 and the second dummy pattern DU2 might not be melted during the laser process. Also, since each of the first dummy pattern DU1 and the second dummy pattern DU2 has a thermal expansion coefficient similar to that of glass, although a temperature gradient is generated between the dummy pattern DU1 and DU2 and the base substrate BS, a stress applied to file base substrate BS may be minimized. Also, since the dummy pattern DU1 and DU2 has a high reflectance with respect to the laser beam LZ1 and LZ2, thermal energy applied to the base substrate BS by the laser beam LZ1 and LZ2 may be minimized.

As a result, according to an embodiment of the inventive concept, since the first dummy pattern DU1 and the second dummy pattern DU2 are disposed at the portions irradiated with the first laser beam LZ1 and the second laser beam LZ2 in an overlapped manner, the base substrate BS might not be damaged.

Figure 15:
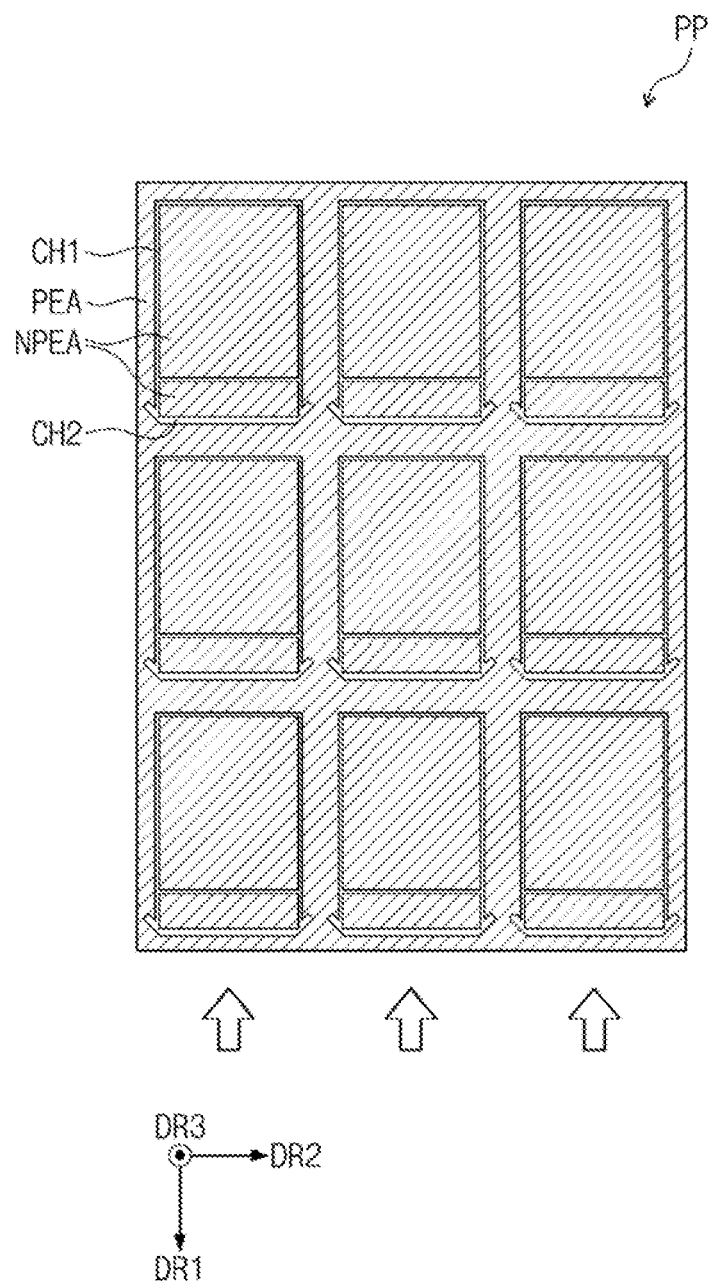
Figure 16:
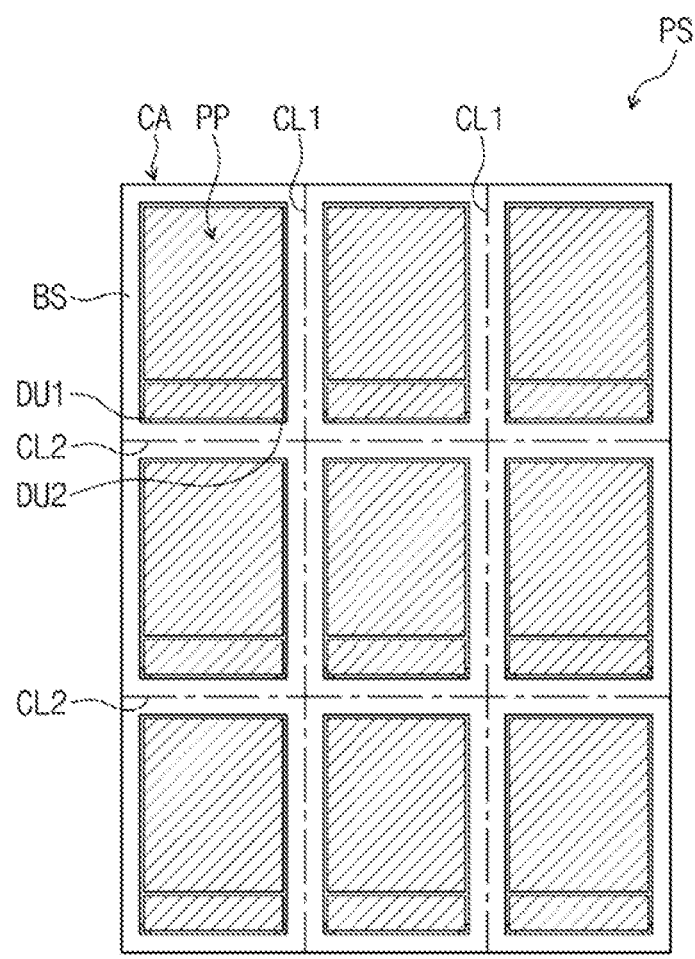
Figure 16:
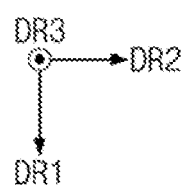

Referring to FIGS. 15 and 16, a portion of the protection pan PP may be peeled in a process S5. A non-peeling area NPEA and a peeling area PEA may be defined in the protection part PP by the first cutting groove CH1 and the second cutting groove CH2.

The non-peeling area NPEA refers to an area surrounded by the first cutting groove CH1 and the second cutting groove CH2. The non-peeling area NPEA may overlap the panel area PA in FIG. 11. The peeling area PEA may refer to an area surrounding the non-peeling area NPEA. The peeling area PEA may overlap the peripheral area BA in FIG. 11. In the process S5, the non-peeling area NPEA may be remained, and the peeling area PEA may be removed.

The process S5 may be performed by a peeling device. The peeling device may include a peeling tape, a peeling adhesive disposed at one end of the peeling tape, and a head part connected to the other end of the peeling tape.

The peeling adhesive may be attached to one portion of the peeling area PEA. An adhesive force between the peeling adhesive and the protection part PP may be greater than that between the panel substrate PS and the adhesive layer ADL of the protection part PP.

The head part may move in one direction (e.g. the first direction DR1) with respect to FIG. 15. Thus, the peeling area PEA and the non-peeling area NPEA may be easily separated from each other by the first cutting groove CH1 and the second cutting groove CH2. Also, the peeling area PEA and the non-peeling area NPEA may be further easily separated from each other by the second cutting groove CH2 cutting the entire thickness portion of the protection part PP.

As illustrated in FIG. 16, after the process S5 is performed, only the non-peeling area PNEA of the protection part PP may be remained on the panel substrate PS. Here, a portion of each of the first dummy pattern DU1 and the second dummy pattern DU2 may be exposed.

The panel substrate PS may be divided into a plurality of display panels by following processes. For example, the panel substrate PS may be divided into a plurality of cell areas CA by a cutting process performed along a first cutting line CL1 and a second cutting line CL2. Each of the plurality of cell areas CA may be manufactured into one display panel through a pixel inspection and a scribing process. The dummy patterns DU1 and DU2 of the panel substrate PS may be removed by the scribing process.

Figure 17:
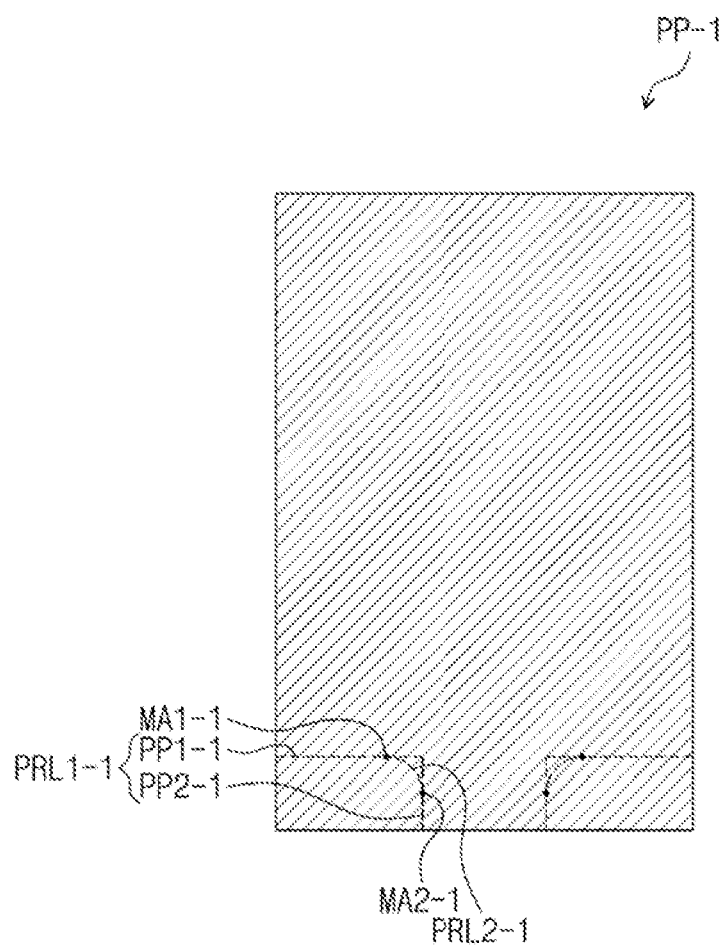
FIGS. 17 to 18 are views for explaining a method for manufacturing a display device according to an exemplary embodiment of the inventive concept.
Figure 18:
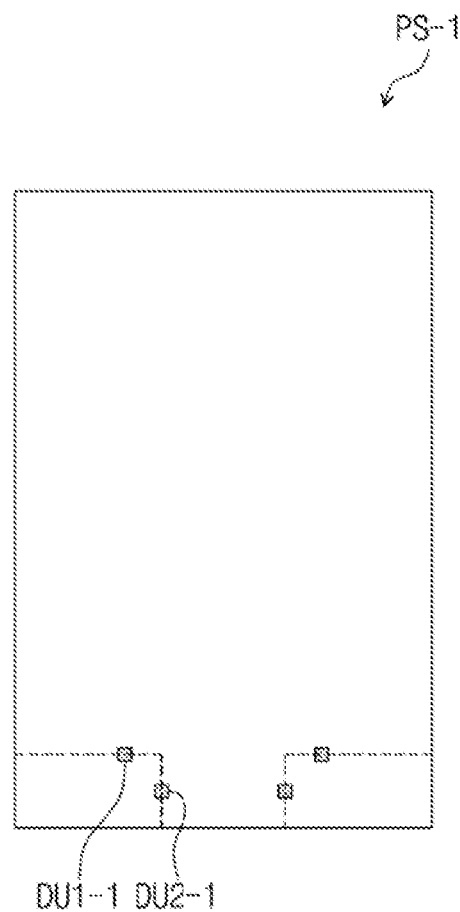

FIGS. 17 to 18 are views for explaining a method for manufacturing the display device according to an exemplary embodiment of the inventive concept. When compared with the panel substrate PS according to the above-described embodiment, a panel substrate PS-1 in FIG. 18 may have the same structure as the panel substrate PS except for a disposed position of dummy patterns DU1-1 and DU2-1.

In this embodiment, the dummy patterns DU1-1 and DU2-1 may overlap a portion processing a curved shape.

Referring to FIGS. 17 and 18, a first processing line PRL1-1 and a second processing line PRL2-1 may be defined on a protection part PP-1. Each of the first processing line PRL1-1 and the second processing line PRL2-1 may be a virtual line indicating an irradiated path of a laser beam.

When viewed on the plane, the first processing line PRL1-1 may include linear portions. For example, the first processing line PRL1-1 may include a first portion PP1-1 extending in the second direction DR2 and a second portion PP2-1 extending in the first direction DR1.

When viewed on the plane, the second processing line PRL2-1 may include a curved portion. The second processing line PRL2-1 and the first processing line PRL1-1 may meet at a first processing point MA1-1 and a second processing point MA2-1. The first processing point MA1-1 and the second processing point MA2-1 may be virtual points defined on the protection part PP-1.

A first dummy pattern DU1-1 and a second dummy pattern DU2-1 may be disposed on the panel substrate PS-1. When viewed on the plane, the first dummy pattern DU1-1 may overlap the first processing point MA1-1 of the protection part PP-1. The second dummy pattern DU2-1 may overlap the second processing point MA2-1 of the protection part PP-1.

The first processing line PRL1-1 and the second processing line PRL2-1 may be irradiated with a first laser beam and a second laser beam, respectively. For example, the first laser beam may partially cut a portion of the protection part PP-1 overlapping the first processing line PRL1-1, and the second laser beam may partially cut a portion of the protection part PP-1 overlapping the second processing line PRL2-1.

Each of the first processing point MA1-1 and the second processing point MA2-1 may be irradiated with the first laser beam and the second laser beam in an overlapped manner. However, according to an embodiment of the inventive concept, since the first dummy pattern DU1-1 overlapping the first processing point MA1-1 and the second dummy pattern DU2-1 overlapping the second processing point MA2-1 are disposed on the panel substrate PS-1, the base substrate of the panel substrate PS-1 might not be damaged.

According to an embodiment of the inventive concept, as the dummy pattern is disposed to overlap the point irradiated with the laser beam a plurality of times, the dummy pattern may protect the base substrate of the panel substrate. Alternatively, according to an embodiment of the inventive concept, the dummy pattern might not be disposed at a specific point. For example, the dummy pattern may be disposed at any point on the panel substrate, at which the base substrate may be damaged by the laser beam.

According to an embodiment of the inventive concept, since the dummy pattern is disposed at the first point of the panel substrate, which overlaps the point at which the first cutting line and the second cutting line meet, although the first point is irradiated with the laser beams in an overlapped manner, the portion overlapping the first point in the base substrate might not be damaged.

Although the exemplary embodiments of the present invention have been described, it is understood that the present invention should not be limited to these exemplary embodiments but various changes and modifications can be made by one ordinary skilled in the art within the spirit and scope of the present disclosure.

What is claimed is:

1. A method for manufacturing a display device, comprising:
   providing a panel substrate comprising a panel area, a peripheral area at least partially surrounding the panel area, and a dummy pattern disposed at a boundary between the panel area and the peripheral area;
   disposing a protection pan on the panel substrate, the protection part including a first processing line overlapping a first outline of the panel area extending from a first point of an outline of the panel area and a second processing line overlapping a second outline of the panel area extending from the first point in a direction different from the first outline;

partially cutting the protection part along, the first processing line; and fully cutting the protection part along the second processing line, wherein the dummy pattern overlaps the first point.

2. The method of claim 1, wherein the partial cutting comprises cutting a portion of the protection part in a thickness direction of the protection part.

3. The method of claim 1, wherein the full cutting comprises cutting the entire protection part in a thickness direction of the protection part.

4. The method of claim 1, wherein, the first processing line comprises:

a first portion extending from a first processing point of the protection part overlapping the first point in a first direction;

a second portion extending from an end of the first portion in a second direction crossing the first direction; and a third portion extending from an end of the second portion in the first direction.

5. The method of claim 4, wherein the second processing line extends from the first processing point in the second direction, and wherein an end of the second processing line meets the third portion at a second processing point.

6. The method of claim 5, wherein the second processing line comprises:

a first extension portion extending from the first processing point in a first inclined direction; and a second extension portion extending from the second processing point in a second inclined direction.

7. The method of claim 4, wherein the panel area comprises:

a first area including a pixel and a signal line having a first end connected to the pixel; and a second area including a pad connected to a second end of the signal line, wherein the first processing line further comprises a fourth portion overlapping a boundary between the first area and the second area.

8. The method of claim 7, wherein the first point is defined as a vertex of the outline of the panel area adjacent to the second area.

9. The method of claim 1, wherein the panel substrate further comprises:

a base substrate; and a pixel layer that is disposed on the base substrate, overlaps the panel area, and comprises an organic light emitting element, wherein the dummy pattern is disposed on the base substrate.

10. The method of claim 9, wherein the pixel layer comprises:

a scan line disposed on the base substrate and extending in a second direction crossing a first direction;

a data line disposed on the scan line and extending in the first direction; and an insulation layer disposed between the scan line and the data line, wherein the dummy pattern is disposed on the same layer as the scan line.

11. The method of claim 10, wherein the dummy pattern comprises molybdenum.

12. The method of claim 9, wherein the base substrate comprises glass, and wherein the dummy pattern comprises a material having a melting temperature that is greater than that of the glass.

13. The method of claim 1, wherein the partial cutting and the full cutting are performed at the same time.

14. The method of claim 1, further comprising peeling a peeling area defined outside the first processing line and the second processing line in the protection part.

15. A method for manufacturing a display device, comprising:

providing a base substrate comprising a panel area and a peripheral area at least partially surrounding the panel area;

forming a pixel layer on the panel area;

forming a dummy pattern on a boundary between the panel area and the peripheral area;

disposing a protection part on the panel area and the peripheral area; and irradiating the protection part with a laser beam along a first processing line overlapping a first outline of the panel area extending from as first point of an outline of the panel area and a second processing line overlapping a second outline of the panel area extending from the first point in a direction different from the first outline.

16. The method of claim 15, wherein the irradiating the protection part with the laser beam comprises:

irradiating the protection part along the first processing line with, a first laser beam; and irradiating the protection part along the second processing line with a second laser beam, wherein the dummy pattern overlaps a point at which the first outline and the second outline meet.

17. The method of claim 16, wherein the first laser beam cuts a portion of the protection part in a thickness direction of the protection part.

18. The method of claim 17, wherein the second laser beam cuts the entire protection part in the thickness direction of the protection part.

19. The method of claim 15, wherein the base substrate comprises glass, and wherein the dummy pattern has a melting temperature that is greater than that of the glass.

20. A panel substrate, comprising:

a base substrate including a panel area and a peripheral area at least partially surrounding the panel area;

a pixel layer disposed on the panel area;

a thin-film encapsulation layer disposed on the pixel layer; and a dummy pattern that is disposed on the base substrate, in a circuit element layer of the panel substrate, and overlaps a boundary between the panel area and the peripheral area.

21. The panel substrate of claim 20, wherein the dummy pattern is disposed within a same layer as a scan line of the panel substrate.

22. The panel substrate of claim 20, further comprising a protection part including a first processing line overlapping a first outline of the panel area extending from a first point of an outline of the panel area and a second processing line overlapping a second outline of the panel area extending from the first point in a direction different from the first outline, wherein the dummy pattern overlaps the first point.

* * * * *